(12) United States Patent
Zhu et al.

(10) Patent No.: US 11,239,202 B2
(45) Date of Patent: Feb. 1, 2022

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Jing Zhu, Shenzhen (CN); Tianhong Wang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 231 days.

(21) Appl. No.: 16/621,740

(22) PCT Filed: Oct. 25, 2019

(86) PCT No.: PCT/CN2019/113157
§ 371 (c)(1),
(2) Date: Dec. 12, 2019

(87) PCT Pub. No.: WO2020/224198
PCT Pub. Date: Nov. 12, 2020

(65) Prior Publication Data
US 2021/0335754 A1   Oct. 28, 2021

(30) Foreign Application Priority Data

May 8, 2019   (CN) .......................... 201910379840.6

(51) Int. Cl.
| *H01L 21/00* | (2006.01) |
| *H01L 25/065* | (2006.01) |
| *H01L 27/12* | (2006.01) |
| *H01L 23/00* | (2006.01) |

(52) U.S. Cl.
CPC ........ *H01L 25/0657* (2013.01); *H01L 27/124* (2013.01); *H01L 24/29* (2013.01); *H01L 24/32* (2013.01); *H01L 2224/29028* (2013.01); *H01L 2224/32106* (2013.01); *H01L 2224/32145* (2013.01)

(58) Field of Classification Search
CPC ............... H01L 25/0657; H01L 27/124; H01L 2224/32106
See application file for complete search history.

(56) References Cited

U.S. PATENT DOCUMENTS

| 11,092,860 B1* | 8/2021 | Lu ........................ H01L 27/1218 |
| 2016/0364072 A1* | 12/2016 | Chiang ................. G02F 1/1368 |
| 2020/0363686 A1* | 11/2020 | Li ...................... G02F 1/133512 |

(Continued)

*Primary Examiner* — Laura M Menz
(74) *Attorney, Agent, or Firm* — Osha Bergman Watanabe & Burton LLP

(57) ABSTRACT

A display panel is provided. The display panel includes a frame area, and the frame area includes an array substrate and a color filter substrate. The array substrate includes a fanout area configured to dispose a fanout trace. The color filter substrate is disposed opposite to the array substrate. The color filter substrate includes a gate driver on array (GOA) circuit and a signal trace disposed at a side of the GOA circuit. The GOA circuit is electrically connected to the signal trace. The GOA circuit and the signal trace both overlap the fanout area.

20 Claims, 2 Drawing Sheets

(56) References Cited

U.S. PATENT DOCUMENTS

| | | | |
|---|---|---|---|
| 2021/0055596 A1* | 2/2021 | Wu | G02F 1/13452 |
| 2021/0173272 A1* | 6/2021 | Chang | H01L 27/32 |
| 2021/0231994 A1* | 7/2021 | Lu | H01L 23/544 |
| 2021/0231995 A1* | 7/2021 | Lu | G02F 1/13452 |

* cited by examiner

DISPLAY PANEL AND DISPLAY DEVICE

BACKGROUND OF INVENTION

Field of Invention

The present invention belongs to the field of display, and more particularly, to a display panel and a display device.

Description of Prior Art

FIG. 1 is a schematic diagram of a display panel of the prior art, in which the display panel includes a display area and a frame area disposed around the display area. The frame area consists of three main parts, i.e., gate driver on array (GOA) circuit units, GOA signal traces, and common electrodes (COM). Since the GOA signal traces are used in large-size and high-resolution products, the resistor-capacitor (RC) loading is heavier. Therefore, it is necessary to use wider GOA signal traces, and thus a larger frame is required.

The box side of the display panels is formed by conductive glues and substrates. Since the conductive glues need to be cured by ultraviolet (UV) irradiation, it is required that the opening ratio of the traces on the side of the array substrates meets certain requirements, in order to enable good curing of the conductive glues.

In view of the above requirements, if the conductive glues do not overlap the GOA signal traces, the GOA signal traces may be solidly designed; meanwhile, if the conductive glues overlap the GOA signal traces, the GOA signal traces will be slit. In order to maintain the effective width of the metal lines, a frame having large width is required in these two situations.

SUMMARY OF INVENTION

In one embodiment of the present invention, a display panel and a display device are provided to solve the technical problem that a frame having large width is required for the conventional display panels.

In one embodiment of the present invention, a display panel is provided. The display panel includes a display area and a frame area disposed at a side of the display area, in which the frame area includes:

an array substrate including a fanout area configured to dispose a fanout trace; and a color filter substrate disposed opposite to the array substrate.

The color filter substrate includes a GOA circuit and a signal trace disposed at a side of the GOA circuit, and the GOA circuit is electrically connected to the signal trace. The GOA circuit and the signal trace both overlap the fanout area.

In the frame area, the array substrate includes a signal connection trace, the signal connection trace is electrically connected to a driver chip which is mounted on the array substrate, and the signal trace is electrically connected to the signal connection trace through a conductive glue.

In the frame area, the GOA circuit includes a plurality of GOA circuit units, each of the GOA circuit units includes a plurality of thin film transistors and a plurality of scanning signal traces electrically connected to the plurality of thin film transistors, the array substrate includes a plurality of scanning signal connection traces, and each of the scanning signal traces is electrically connected to each of the scanning signal connection traces through the conductive glue.

In the frame area, the scanning signal trace is electrically connected to a scanning line through the scanning signal connection trace, and an extending direction of the scanning signal connection trace is perpendicular to an extending direction of the scanning line.

The color filter substrate includes a first substrate, a first metal layer, a first insulation layer, a second metal layer, a second insulation layer, a first planarization layer, and a first transparent conductive layer disposed in order.

The array substrate includes a second substrate, a third metal layer, a third insulation layer, a fourth metal layer, a fourth insulation layer, a fifth metal layer, a second planarization layer, and a second transparent conductive layer disposed in order.

In the frame area, the first transparent conductive layer is electrically connected to the second transparent conductive layer through the conductive glue.

In the frame area of the display panel of the present invention, the signal connection trace is formed in the third metal layer, the signal connection trace is connected to the fourth metal layer through a first via hole, the fourth metal layer is connected to the second transparent conductive layer through a second via hole, the signal trace is formed in the first metal layer, the signal trace is connected to the second metal layer through a third via hole, and the second metal layer is connected to the first transparent conductive layer through a fourth via hole.

In the frame area of the display panel of the present invention, the scanning signal connection trace is formed in the fifth metal layer, one end of the scanning signal connection trace is connected to the fourth metal layer through a fifth via hole, the fourth metal layer is connected to the third metal layer through a sixth via hole, the other end of the scanning signal connection trace is connected to the second transparent conductive layer through a seventh via hole, the scanning signal trace is formed in the second metal layer, and the scanning signal trace is connected to the first transparent conductive layer through an eighth via hole.

In the frame area of the display panel of the present invention, the fanout trace is formed in the third metal layer.

In one embodiment of the present invention, a display panel is further provided. The display panel includes a display area and a frame area disposed at a side of the display area, in which the frame area includes:

an array substrate including a fanout area configured to dispose a fanout trace; and a color filter substrate disposed opposite to the array substrate.

The color filter substrate includes a GOA circuit and a signal trace disposed at a side of the GOA circuit, and the GOA circuit is electrically connected to the signal trace. The GOA circuit and the signal trace both overlap the fanout area.

In the frame area of the display panel of the present invention, the array substrate includes a signal connection trace, the signal connection trace is electrically connected to a driver chip which is mounted on the array substrate, and the signal trace is electrically connected to the signal connection trace through a conductive glue.

In the frame area of the display panel of the present invention, the GOA circuit includes a plurality of GOA circuit units, each of the GOA circuit units includes a plurality of thin film transistors and a plurality of scanning signal traces electrically connected to the plurality of thin film transistors, the array substrate includes a plurality of scanning signal connection traces, and each of the scanning signal traces is electrically connected to each of the scanning signal connection traces through the conductive glue.

In the frame area of the display panel of the present invention, the scanning signal trace is electrically connected to the scanning line through the scanning signal connection trace.

In the display panel of the present invention, an extending direction of the scanning signal connection trace is perpendicular to an extending direction of the scanning line.

In the display panel of the present invention, the color filter substrate includes a first substrate, a first metal layer, a first insulation layer, a second metal layer, a second insulation layer, a first planarization layer, and a first transparent conductive layer disposed in order.

The array substrate includes a second substrate, a third metal layer, a third insulation layer, a fourth metal layer, a fourth insulation layer, a fifth metal layer, a second planarization layer, and a second transparent conductive layer disposed in order.

In the frame area, the first transparent conductive layer is electrically connected to the second transparent conductive layer through the conductive glue.

In the frame area of the display panel of the present invention, the signal connection trace is formed in the third metal layer, the signal connection trace is connected to the fourth metal layer through a first via hole, the fourth metal layer is connected to the second transparent conductive layer through a second via hole, the signal trace is formed in the first metal layer, the signal trace is connected to the second metal layer through a third via hole, and the second metal layer is connected to the first transparent conductive layer through a fourth via hole.

In the frame area of the display panel of the present invention, the scanning signal connection trace is formed in the fifth metal layer, one end of the scanning signal connection trace is connected to the fourth metal layer through a fifth via hole, the fourth metal layer is connected to the third metal layer through a sixth via hole, the other end of the scanning signal connection trace is connected to the second transparent conductive layer through a seventh via hole, the scanning signal trace is formed in the second metal layer, and the scanning signal trace is connected to the first transparent conductive layer through an eighth via hole.

In the frame area of the display panel of the present invention, the fanout trace is formed in the third metal layer.

The present invention also relates to a display device including a display panel. The display panel includes a display area and a frame area disposed at a side of the display area, in which the frame area includes:

an array substrate including a fanout area configured to dispose a fanout trace; and a color filter substrate disposed opposite to the array substrate.

The color filter substrate includes a GOA circuit and a signal trace disposed at a side of the GOA circuit, and the GOA circuit is electrically connected to the signal trace. The GOA circuit and the signal trace both overlap the fanout area.

In the frame area of the display panel of the present invention, the array substrate includes a signal connection trace, the signal connection trace is electrically connected to a driver chip which is mounted on the array substrate, and the signal trace is electrically connected to the signal connection trace through a conductive glue.

In the frame area of the display device of the present invention, the GOA circuit includes a plurality of GOA circuit units, each of the GOA circuit units includes a plurality of thin film transistors and a plurality of scanning signal traces electrically connected to the plurality of thin film transistors, the array substrate includes a plurality of scanning signal connection traces, and each of the scanning signal traces is electrically connected to each of the scanning signal connection traces through the conductive glue.

In the frame area of the display device of the present invention, the scanning signal trace is electrically connected to the scanning line through the scanning signal connection trace.

In the display device of the present invention, an extending direction of the scanning signal connection trace is perpendicular to an extending direction of the scanning line.

In the display device of the present invention, the color filter substrate includes a first substrate, a first metal layer, a first insulation layer, a second metal layer, a second insulation layer, a first planarization layer, and a first transparent conductive layer disposed in order.

The array substrate includes a second substrate, a third metal layer, a third insulation layer, a fourth metal layer, a fourth insulation layer, a fifth metal layer, a second planarization layer, and a second transparent conductive layer disposed in order.

In the frame area, the first transparent conductive layer is electrically connected to the second transparent conductive layer through the conductive glue.

In the frame area of the display device of the present invention, the signal connection trace is formed in the third metal layer, the signal connection trace is connected to the fourth metal layer through a first via hole, the fourth metal layer is connected to the second transparent conductive layer through a second via hole, the signal trace is formed in the first metal layer, the signal trace is connected to the second metal layer through a third via hole, and the second metal layer is connected to the first transparent conductive layer through a fourth via hole.

In the frame area of the display device of the present invention, the scanning signal connection trace is formed in the fifth metal layer, one end of the scanning signal connection trace is connected to the fourth metal layer through a fifth via hole, the fourth metal layer is connected to the third metal layer through a sixth via hole, the other end of the scanning signal connection trace is connected to the second transparent conductive layer through a seventh via hole, the scanning signal trace is formed in the second metal layer, and the scanning signal trace is connected to the first transparent conductive layer through an eighth via hole.

In the frame area of the display device of the present invention, the fanout trace is formed in the third metal layer.

In comparison with the conventional display panel, the display panel and the display device of the present invention reduce the width of frame at two sides of the display panel by disposing the GOA circuit and the signal trace on the color filter substrate, and making them overlap the fanout area on the array substrate. Therefore, the technical problem that a frame having large width is required for the conventional display panels is solved.

BRIEF DESCRIPTION OF DRAWINGS

In order to more clearly illustrate the technical solutions in the embodiments of the present invention and the prior art, the drawings described in the description of the embodiments are briefly described below. It is obvious that the drawings in the following description are only some embodiments of the present invention. Other drawings may also be obtained from a person skilled in the art based on the drawings without any creative effort.

DETAILED DESCRIPTION OF PREFERRED EMBODIMENTS

Figure 1:
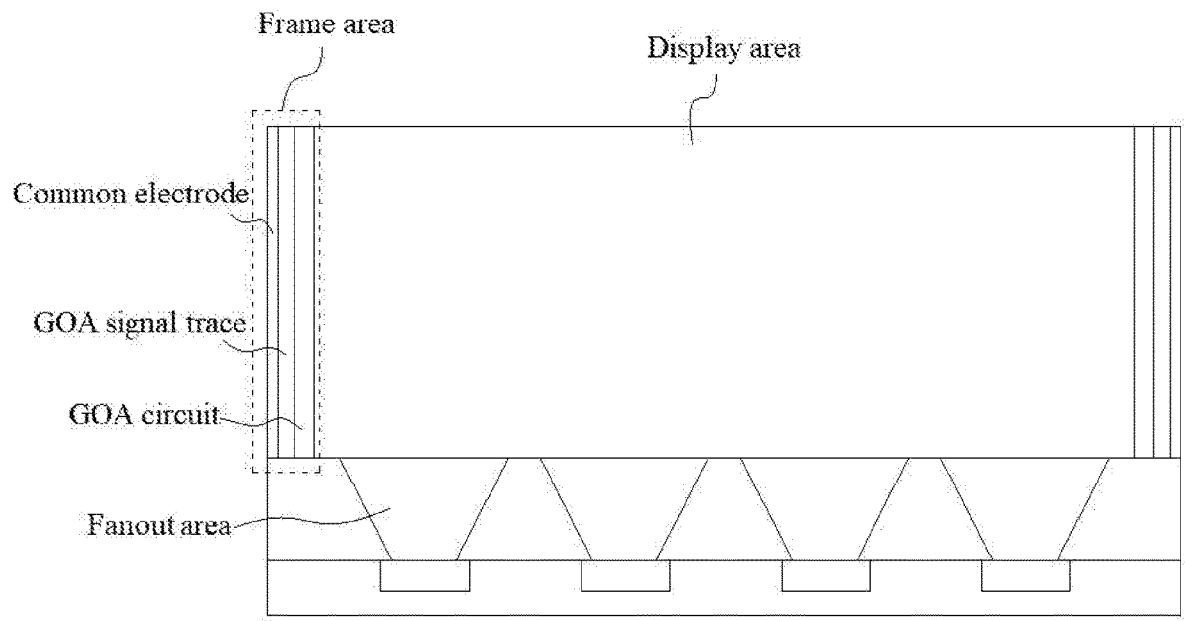
FIG. 1 is a schematic view of a structure of a display panel of the prior art.

In the drawings, identical components are marked with the same reference numerals. The following descriptions are based on the exemplary embodiments of the present invention, and the present invention should not be limited by other embodiments that are not described herein.

Figure 2:
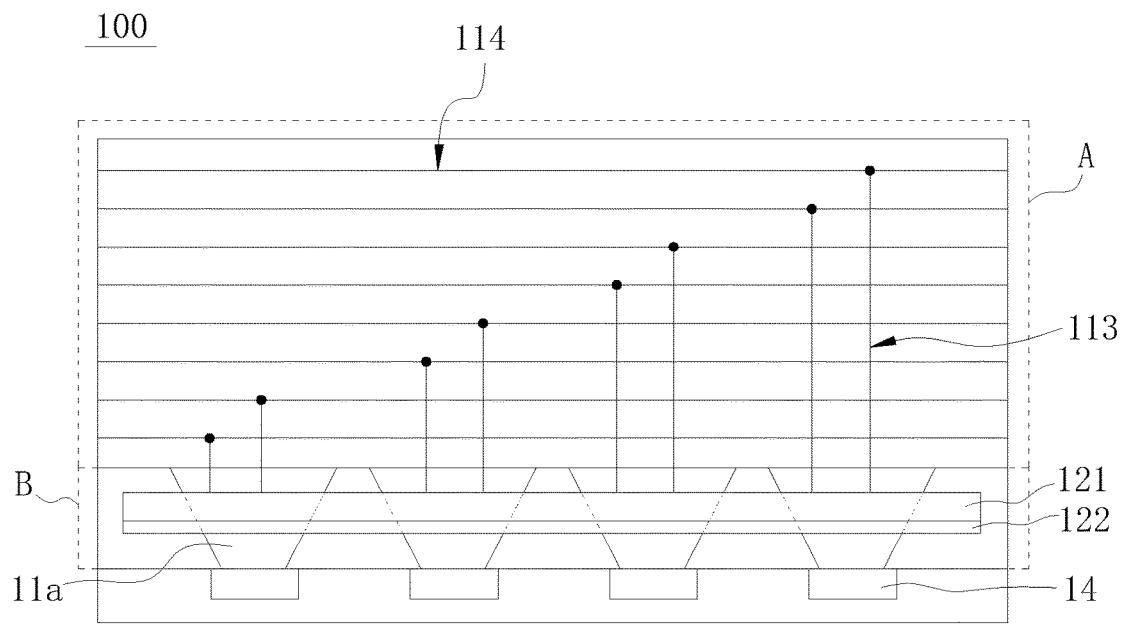
FIG. 2 is a schematic view of a structure of a display panel according to one embodiment of the present invention.
Figure 3:
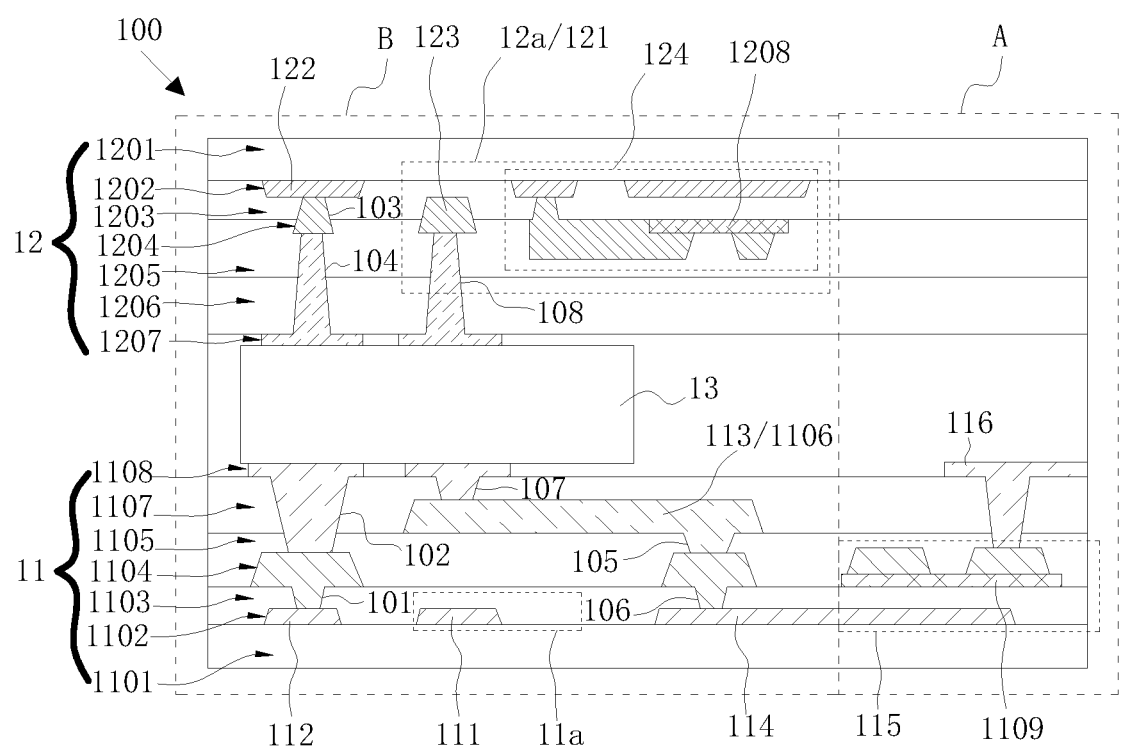
FIG. 3 is another schematic view of a structure of a display panel according to one embodiment of the present invention.

Referring to FIGS. 2 and 3, FIG. 2 is a schematic view of a structure of a display panel according to one embodiment of the present invention, and FIG. 3 is another schematic view of a structure of the display panel according to one embodiment of the present invention. In one embodiment of the present invention, a display panel 100 includes a display area A and a frame area B disposed at a side of the display area A. The frame area B includes an array substrate 11 and a color filter substrate 12.

The array substrate 11 includes a fanout area 11a configured to dispose a fanout trace 111. The color filter substrate 12 is disposed opposite to the array substrate 11. The color filter substrate 12 includes a GOA circuit 121 and a signal trace 122 disposed at a side of the GOA circuit 121. The GOA circuit 121 is electrically connected to the signal trace 122.

The GOA circuit 121 and the signal trace 122 both overlap the fanout area 11a.

In the display panel 100 according to one embodiment of the present invention, a width of frame at two sides of the display panel is reduced by disposing the GOA circuit 121 and the signal trace 122 on the color filter substrate 12, and making them overlap the fanout area 11a on the array substrate 11.

In the frame area B, the array substrate 11 is steadily connected to the color filter substrate 12 by a conductive glue 13. Since the GOA circuit 121 and the signal trace 122 are disposed on the color filter substrate 12, backlight from the array substrate 11 will not be affected. Therefore, a trace of the GOA circuit 121 and the signal trace 122 may be solidly designed, and slit in the trace due to opening ratio may be omitted. Accordingly, space required for the GOA circuit 121 and the signal trace 122 is reduced, thereby reducing a width of the frame area B.

It should be identified that in the process of forming a box of the display panel, the array substrate 11 and the color filter substrate 12 are steadily and electrically connected to each other by the conductive glue 13 in the frame area B. In the process of forming the box, the conductive glue 13 is required to be irradiated with ultraviolet for curing. Therefore, the GOA circuit 121 and the signal trace 122 are disposed on the color filter substrate 12; that is to say, the GOA circuit 121 and the signal trace 122 are disposed on the conductive glue 13, such that light is directly transmitted through the array substrate 11 to irradiate the conductive glue 13, and then the conductive glue 13 is cured. Accordingly, in this embodiment, the trace of the GOA circuit 121 and the signal trace 122 may be solidly designed.

Additionally, since the array substrate 11 and the color filter substrate 12 are steadily and electrically connected to each other by the conductive glue 13, manufacturing time of transfer pad is saved, and manufacturing efficiency is improved.

Specifically, in the frame area B of the display panel 100 of this embodiment, the array substrate 11 includes a signal connection trace 112. The signal connection trace 112 is electrically connected to a driver chip (not shown) which is mounted on the array substrate 11.

The signal trace 122 is electrically connected to the signal connection trace 112 by the conductive glue 13.

In the frame area B of the display panel 100 of this embodiment, the GOA circuit 121 includes a plurality of GOA circuit units 12a. Each of the GOA circuit units 12a includes a plurality of thin film transistors 124 and a plurality of scanning signal traces 123 electrically connected to the plurality of thin film transistors 124. The array substrate 11 includes a plurality of scanning signal connection traces 113.

Each of the scanning signal traces 123 is electrically connected to each of the scanning signal connection traces 113 by the conductive glue 13.

In the frame area B of the display panel 100 of this embodiment, the scanning signal trace 123 is electrically connected to a scanning line 114 through the scanning signal connection trace 113. The scanning signal connection trace 113 introduces a gate signal in the display area A into the frame on a corresponding side of the driver chip 14, and it is electrically connected to the GOA circuit unit 12a by the conductive glue 13.

In the display panel 100 of this embodiment, an extending direction of the scanning signal connection trace 113 is perpendicular to an extending direction of the scanning line 114.

Specifically, in the display panel 100 of this embodiment, the color filter substrate 12 includes a first substrate 1201, a first metal layer 1202, a first insulation layer 1203, a second metal layer 1204, a second insulation layer 1205, a first planarization layer 1206, and a first transparent conductive layer 1207 disposed in order.

The array substrate 11 includes a second substrate 1101, a third metal layer 1102, a third insulation layer 1103, a fourth metal layer 1104, a fourth insulation layer 1105, a fifth metal layer 1106, a second planarization layer 1107, and a second transparent conductive layer 1108 disposed in order.

In the frame area B, the first transparent conductive layer 1207 is electrically connected to the second transparent conductive layer 1108 by the conductive glue 13. Furthermore, the first transparent conductive layer 1207 and the second transparent conductive layer 1108 both are indium tin oxide (ITO) layers.

In the frame area B of the display panel 100 of this embodiment, the signal connection trace 112 is formed in the third metal layer 1102. The signal connection trace 112 is connected to the fourth metal layer 1104 through a first via hole 101. The fourth metal layer 1104 is connected to the second transparent conductive layer 1108 through a second via hole 102.

The signal trace 122 is formed in the first metal layer 1202. The signal trace 122 is connected to the second metal layer 1204 through a third via hole 103. The second metal layer 1204 is connected to the first transparent conductive layer 1207 through a fourth via hole 104.

The gate signal is sequentially transmitted to the signal connection trace 112, the first via hole 101, the fourth metal layer 1104, the second via hole 102, and the second transparent conductive layer 1108, and then sequentially transmitted to the conductive glue 13, the first transparent conductive layer 1207, the fourth via hole 104, the second metal layer 1204, the third via hole 103, and the signal trace 122. Afterwards, the signal trace 122 conducts the gate signal to the GOA circuit 121.

In the frame area B of the display panel 100 of this embodiment, the scanning signal connection trace 113 is formed in the fifth metal layer 1106. One end of the scanning signal connection trace 113 is connected to the fourth metal layer 1104 through a fifth via hole 105. The fourth metal layer 1104 is connected to the third metal layer 1102 through a sixth via hole 106. The other end of the scanning signal connection trace 113 is connected to the second transparent conductive layer 1108 through a seventh via hole 107.

A gate of the thin film transistor 124 is formed in the first metal layer 1202. A source and a drain of the thin film transistor 124 are formed in the second metal layer 1204. A channel area of the thin film transistor 124 is formed in an active layer 1208.

The scanning signal trace 123 is formed in the second metal layer 1204. The scanning signal trace 123 is connected to the first transparent conductive layer 1207 through an eighth via hole 108.

The thin film transistor 124 of the GOA circuit 121 conducts a driving signal to the scanning signal trace 123. Furthermore, the driving signal sequentially passes through the eighth via hole 108, the first transparent conductive layer 1207, the conductive glue 13, the second transparent conductive layer 1108, the seventh via hole 107, the scanning signal connection trace 113, the fifth via hole 105, the fourth metal layer 1104, and the sixth via hole 106, and is transmitted to the scanning line 114 of the third metal layer 1102 of the display area A.

In the frame area B of the display panel 100 of this embodiment, the fanout trace 111 is formed in the third metal layer 1102. Specifically, the fanout trace 111 is disposed below the GOA circuit 121 and the signal trace 122. The fanout trace 111 is electrically connected to the driver chip 14. FIG. 3 only shows one fanout trace 111, but this embodiment is not limited thereto.

In some embodiments, the fanout trace may be formed in the fourth metal layer.

In this embodiment, a stream of the gate signal is that: the gate signal is transmitted from the signal connection trace 113 to the signal trace 122 through the conductive glue 13. Furthermore, the gate signal is transmitted from the signal trace 122 to the GOA circuit unit 12a in the GOA circuit 121, such that the thin film transistor 124 of the GOA circuit unit 12a generates a driving signal, and the driving signal is transmitted from the scanning signal trace 123 to the scanning signal connection trace 113 through the conductive glue 13, and finally to the scanning line 114 of the display area A.

Additionally, in the display area A, the array substrate 11 includes a plurality of driving thin film transistors 115 and a pixel electrode 116 disposed on the thin film transistor 115. The pixel electrode 116 is formed in the second transparent conductive layer 1108. A gate of the driving thin film transistor 115 is formed in the third metal layer 1102. A source and a drain of the driving thin film transistor 115 are formed in the fourth metal layer 1104. A channel area of the driving thin film transistor 115 is formed in an active layer 1109. The scanning line 114 is formed in the third metal layer 1102. The scanning line 114 is electrically connected to the gate of the driving thin film transistor 115.

The present invention also relates to a display device including a display panel. The display panel includes a display area and a frame area disposed at a side of the display area, and the frame area includes:

an array substrate including a fanout area configured to dispose a fanout trace; and a color filter substrate disposed opposite to the array substrate.

The color filter substrate includes a GOA circuit and a signal trace disposed at a side of the GOA circuit, the GOA circuit is electrically connected to the signal trace, and the GOA circuit and the signal trace both overlap the fanout area.

In the frame area of the display panel of the present invention, the array substrate includes a signal connection trace, the signal connection trace is electrically connected to a driver chip which is mounted on the array substrate, and the signal trace is electrically connected to the signal connection trace by a conductive glue.

In the frame area of the display device of the present invention, the GOA circuit includes a plurality of GOA circuit units, each of the GOA circuit units includes a plurality of thin film transistors and a plurality of scanning signal traces electrically connected to the plurality of thin film transistors, the array substrate includes a plurality of scanning signal connection traces, and each of the scanning signal traces is electrically connected to each of the scanning signal connection traces by the conductive glue.

In the frame area of the display device of the present invention, the scanning signal trace is electrically connected to the scanning line through the scanning signal connection trace.

In the display device of the present invention, an extending direction of the scanning signal connection trace is perpendicular to an extending direction of the scanning line.

In the display device of the present invention, the color filter substrate includes a first substrate, a first metal layer, a first insulation layer, a second metal layer, a second insulation layer, a first planarization layer, and a first transparent conductive layer disposed in order.

The array substrate includes a second substrate, a third metal layer, a third insulation layer, a fourth metal layer, a fourth insulation layer, a fifth metal layer, a second planarization layer, and a second transparent conductive layer disposed in order.

In the frame area, the first transparent conductive layer is electrically connected to the second transparent conductive layer by the conductive glue.

In the frame area of the display device of the present invention, the signal connection trace is formed in the third metal layer, the signal connection trace is connected to the fourth metal layer through a first via hole, and the fourth metal layer is connected to the second transparent conductive layer through a second via hole.

The signal trace is formed in the first metal layer, the signal trace is connected to the second metal layer through a third via hole, and the second metal layer is connected to the first transparent conductive layer through a fourth via hole.

In the frame area of the display device of the present invention, the scanning signal connection trace is formed in the fifth metal layer, one end of the scanning signal connection trace is connected to the fourth metal layer through a fifth via hole, the fourth metal layer is connected to the third metal layer through a sixth via hole, the other end of the scanning signal connection trace is connected to the second transparent conductive layer through a seventh via hole, the scanning signal trace is formed in the second metal layer, and the scanning signal trace is connected to the first transparent conductive layer through an eighth via hole.

In the frame area of the display device of the present invention, the fanout trace is formed in the third metal layer.

In comparison with the conventional display panel, the display panel and the display device of the present invention reduce the width of frame at two sides of the display panel by disposing the GOA circuit and the signal trace on the color filter substrate, and making them overlap the fanout area on the array substrate. Therefore, the technical problem that a frame having large width is required for the conventional display panels is solved In the above, a person skilled in the art may make various changes and modifications based on the technical solutions and concepts, and thus such changes and modifications fall within the scope of the claims of the present invention.

What is claimed is:

1. A display panel, comprising a display area and a frame area disposed at a side of the display area, wherein the frame area comprises:

an array substrate comprising a fanout area configured to dispose a fanout trace; and a color filter substrate disposed opposite to the array substrate, wherein the color filter substrate comprises a gate driver on array (GOA) circuit and a signal trace disposed at a side of the GOA circuit, the GOA circuit is electrically connected to the signal trace, and the GOA circuit and the signal trace both overlap the fanout area;

wherein in the frame area, the array substrate comprises a signal connection trace, the signal connection trace is electrically connected to a driver chip which is mounted on the array substrate, and the signal trace is electrically connected to the signal connection trace by a conductive glue;

wherein in the frame area, the GOA circuit comprises a plurality of GOA circuit units, each of the GOA circuit units comprises a plurality of thin film transistors and a plurality of scanning signal traces electrically connected to the plurality of thin film transistors, the array substrate comprises a plurality of scanning signal connection traces, and each of the scanning signal traces is electrically connected to each of the scanning signal connection traces by the conductive glue;

wherein in the frame area, the scanning signal trace is electrically connected to a scanning line through the scanning signal connection trace, an extending direction of the scanning signal connection trace is perpendicular to an extending direction of the scanning line;

wherein the color filter substrate comprises a first substrate, a first metal layer, a first insulation layer, a second metal layer, a second insulation layer, a first planarization layer, and a first transparent conductive layer disposed in order;

wherein the array substrate comprises a second substrate, a third metal layer, a third insulation layer, a fourth metal layer, a fourth insulation layer, a fifth metal layer, a second planarization layer, and a second transparent conductive layer disposed in order; and wherein in the frame area, the first transparent conductive layer is electrically connected to the second transparent conductive layer by the conductive glue.

2. The display panel according to claim 1, wherein in the frame area, the signal connection trace is formed in the third metal layer, the signal connection trace is connected to the fourth metal layer through a first via hole, the fourth metal layer is connected to the second transparent conductive layer through a second via hole, the signal trace is formed in the first metal layer, the signal trace is connected to the second metal layer through a third via hole, and the second metal layer is connected to the first transparent conductive layer through a fourth via hole.

3. The display panel according to claim 1, wherein in the frame area, the scanning signal connection trace is formed in the fifth metal layer, one end of the scanning signal connection trace is connected to the fourth metal layer through a fifth via hole, the fourth metal layer is connected to the third metal layer through a sixth via hole, the other end of the scanning signal connection trace is connected to the second transparent conductive layer through a seventh via hole, the scanning signal trace is formed in the second metal layer, and the scanning signal trace is connected to the first transparent conductive layer through an eighth via hole.

4. The display panel according to claim 1, wherein in the frame area, the fanout trace is formed in the third metal layer.

5. A display panel, comprising a display area and a frame area disposed at a side of the display area, wherein the frame area comprises:

an array substrate comprising a fanout area configured to dispose a fanout trace; and a color filter substrate disposed opposite to the array substrate, wherein the color filter substrate comprises a gate driver on array (GOA) circuit and a signal trace disposed at a side of the GOA circuit, the GOA circuit is electrically connected to the signal trace, and the GOA circuit and the signal trace both overlap the fanout area.

6. The display panel according to claim 5, wherein in the frame area, the array substrate comprises a signal connection trace, the signal connection trace is electrically connected to a driver chip which is mounted on the array substrate, and the signal trace is electrically connected to the signal connection trace by a conductive glue.

7. The display panel according to claim 6, wherein in the frame area, the GOA circuit comprises a plurality of GOA circuit units, each of the GOA circuit units comprises a plurality of thin film transistors and a plurality of scanning signal traces electrically connected to the plurality of thin film transistors, the array substrate comprises a plurality of scanning signal connection traces, and each of the scanning signal traces is electrically connected to each of the scanning signal connection traces by the conductive glue.

8. The display panel according to claim 7, wherein in the frame area, the scanning signal trace is electrically connected to a scanning line through the scanning signal connection trace.

9. The display panel according to claim 8, wherein an extending direction of the scanning signal connection trace is perpendicular to an extending direction of the scanning line.

10. The display panel according to claim 9, wherein the color filter substrate comprises a first substrate, a first metal layer, a first insulation layer, a second metal layer, a second insulation layer, a first planarization layer, and a first transparent conductive layer disposed in order;

wherein the array substrate comprises a second substrate, a third metal layer, a third insulation layer, a fourth metal layer, a fourth insulation layer, a fifth metal layer, a second planarization layer, and a second transparent conductive layer disposed in order; and wherein in the frame area, the first transparent conductive layer is electrically connected to the second transparent conductive layer by the conductive glue.

11. The display panel according to claim 10, wherein in the frame area, the signal connection trace is formed in the third metal layer, the signal connection trace is connected to the fourth metal layer through a first via hole, the fourth metal layer is connected to the second transparent conductive layer through a second via hole, the signal trace is formed in the first metal layer, the signal trace is connected to the second metal layer through a third via hole, and the second metal layer is connected to the first transparent conductive layer through a fourth via hole.

12. The display panel according to claim 10, wherein in the frame area, the scanning signal connection trace is formed in the fifth metal layer, one end of the scanning signal connection trace is connected to the fourth metal layer through a fifth via hole, the fourth metal layer is connected to the third metal layer through a sixth via hole, the other end of the scanning signal connection trace is connected to the second transparent conductive layer through a seventh via hole, the scanning signal trace is formed in the second metal layer, and the scanning signal trace is connected to the first transparent conductive layer through an eighth via hole.

13. The display panel according to claim 10, wherein in the frame area, the fanout trace is formed in the third metal layer.

14. A display device, comprising a display panel, wherein the display panel comprises a display area and a frame area disposed at a side of the display area, and the frame area comprises:
an array substrate comprising a fanout area configured to dispose a fanout trace; and
a color filter substrate disposed opposite to the array substrate, wherein the color filter substrate comprises a gate driver on array (GOA) circuit and a signal trace disposed at a side of the GOA circuit, the GOA circuit is electrically connected to the signal trace, and the GOA circuit and the signal trace both overlap the fanout area.

15. The display device according to claim 14, wherein in the frame area, the array substrate comprises a signal connection trace, the signal connection trace is electrically connected to a driver chip which is mounted on the array substrate, and the signal trace is electrically connected to the signal connection trace by a conductive glue.

16. The display device according to claim 15, wherein in the frame area, the GOA circuit comprises a plurality of GOA circuit units, each of the GOA circuit units comprises a plurality of thin film transistors and a plurality of scanning signal traces electrically connected to the plurality of thin film transistors, the array substrate comprises a plurality of scanning signal connection traces, and each of the scanning signal traces is electrically connected to each of the scanning signal connection traces by the conductive glue.

17. The display device according to claim 16, wherein in the frame area, the scanning signal trace is electrically connected to a scanning line through the scanning signal connection trace.

18. The display device according to claim 17, wherein an extending direction of the scanning signal connection trace is perpendicular to an extending direction of the scanning line.

19. The display device according to claim 18, wherein the color filter substrate comprises a first substrate, a first metal layer, a first insulation layer, a second metal layer, a second insulation layer, a first planarization layer, and a first transparent conductive layer disposed in order;
wherein the array substrate comprises a second substrate, a third metal layer, a third insulation layer, a fourth metal layer, a fourth insulation layer, a fifth metal layer, a second planarization layer, and a second transparent conductive layer disposed in order; and
wherein in the frame area, the first transparent conductive layer is electrically connected to the second transparent conductive layer by the conductive glue.

20. The display device according to claim 19, wherein in the frame area, the signal connection trace is formed in the third metal layer, the signal connection trace is connected to the fourth metal layer through a first via hole, the fourth metal layer is connected to the second transparent conductive layer through a second via hole, the signal trace is formed in the first metal layer, the signal trace is connected to the second metal layer through a third via hole, and the second metal layer is connected to the first transparent conductive layer through a fourth via hole.

* * * * *